United States Patent [19]
Ohtsuka et al.

[11] Patent Number: 5,006,483
[45] Date of Patent: Apr. 9, 1991

[54] FABRICATION OF P-N JUNCTION SEMICONDUCTOR DEVICE

[75] Inventors: Koji Ohtsuka, Shiki; Hirokazu Goto, Hannou, both of Japan

[73] Assignee: Sanken Electric Co., Ltd., Saitama, Japan

[21] Appl. No.: 544,202

[22] Filed: Jun. 26, 1990

Related U.S. Application Data

[62] Division of Ser. No. 319,951, Mar. 7, 1989.

[30] Foreign Application Priority Data

Mar. 31, 1988 [JP] Japan ................................. 63-80173

[51] Int. Cl.⁵ .......................................... M01L 21/443
[52] U.S. Cl. .................................... 437/179; 437/177; 437/184; 437/904; 148/DIG. 140
[58] Field of Search .................. 437/904, 175, , 176, 437/167, 179, 184, 187, 177; 148/DIG. 56, DIG. 139, DIG. 140; 357/15

[56] References Cited

U.S. PATENT DOCUMENTS

| | | | |
|---|---|---|---|
| 3,923,975 | 12/1975 | Calviello | 437/179 |
| 4,149,307 | 4/1979 | Henderson | 437/187 |
| 4,307,132 | 12/1981 | Chu et al. | 437/175 |
| 4,636,833 | 1/1987 | Nishioka et al. | 357/15 |

FOREIGN PATENT DOCUMENTS 0128875 10/1980 Japan ................................ 437/179

Primary Examiner—Brian E. Hearn
Assistant Examiner—Chandra Chaudhari
Attorney, Agent, or Firm—Woodcock Washburn Kurtz Mackiewicz & Norris

[57] ABSTRACT

A gallium arsenide diode is disclosed which has a very thin resistive layer of a metal oxide, typically titanium oxide, formed annularly on a semiconductor substrate across the exposed annular periphery of a p-n junction. The titanium oxide layer has a sheet resistance of not less than 10 kilohms per square and creates a Schottky barrier between itself and the neighboring n type region of the substrate. The titanium oxide layer can be formed by first vacuum depositing titanium on the substrate and then heating the titanium layer.

4 Claims, 3 Drawing Sheets

FABRICATION OF P-N JUNCTION SEMICONDUCTOR DEVICE

This is a division, of application Ser. No. 319,951, filed Mar. 7, 1989.

BACKGROUND OF THE INVENTION

Our invention relates generally to semiconductor devices, and more specifically to a semiconductor device such as a rectifier diode having a p-n junction of an improved voltage withstanding capability. Our invention also specifically concerns a method of making such a p-n junction semiconductor device.

A variety of expedients have been suggested and used for higher breakdown voltages of p-n junction devices. Typical of such known expedients are the field plate and the floating field limiting ring. The field plate is disclosed in the article entitled "Relation between Oxide Thickness and the Breakdown Voltage of a Planar Junction with Field Relief Electrode" by O'neil et al. in the Vol. ED-26, No. 7, issue of *IEEE Transactions of Electron Devices*. The field ring is disclosed in the article entitled "Theory and Breakdown Voltage for Planar Devices with a Single Field Limiting Ring" by Adler et al. in the Vol. ED-24, No. 2 issue of *IEEE Transactions on Electron Devices*.

Still another known construction includes a floating Schottky barrier metal electrode on the semiconductor substrate, in substitution for the field ring, as taught by Japanese Unexamined Patent Publication No. 54-118781.

SUMMARY OF THE INVENTION

We have explored the possibilities of making the breakdown voltages of p-n junction semiconductor devices higher than those attained by the above referenced prior art devices and have hereby invented how to construct and fabricate such improved p-n junction devices.

Briefly, our invention may be summarized in one aspect thereof as a p-n junction semiconductor device having a substrate comprised of a first semiconductor region of a first conductivity type (e.g. n type), and a second semiconductor region of a second conductivity type (e.g. p type) opposite to the first conductivity type. The second semiconductor region is of lower resistivity than the first semiconductor region. The first and second semiconductor regions are disposed contiguous to each other with the consequent creation of a p-n junction therebetween. The second semiconductor region has an electrode formed thereon. A thin resistive layer is formed at least on the first semiconductor region so as to surround the electrode on the second semiconductor region and is electrically connected to that electrode. The resistive layer is of such a material as to provide a sheet resistance of not less than 10 kilohms per square and provide a Schottky barrier between itself and the first semiconductor region. Alternatively, the resistive layer may be formed on both first and second semiconductor region across the periphery of the p-n junction therebetween.

When a reverse voltage is impressed across the p-n junction of the semiconductor device constructed as in the foregoing, there is created not only a depletion layer due to the p-n junction but also that due to the thin resistive layer in conjunction with the first semiconductor region. These depletion layers combine into a continuous whole. The resistive layer acts as a high resistance field plate on the first semiconductor region, with no insulating layer interposed therebetween, thereby drastically mitigating the concentrations of the electric field at the curved and peripheral portions of the p-n junction.

Another aspect of our invention concerns a method of producing the p-n junction semiconductor device of the above summarized construction. The thin resistive layer characterizing the semicondutor device of our invention is usually made of a metal oxide, typically titanium oxide. For the most efficient production of the semiconductor device the metal oxide layer is formed by heating and so oxidizing a metal layer preformed, as by vacuum deposition, in place on the semiconductor substrate.

The above and other features and advantages of our invention and the manner of realizing them will become more apparent, and the invention itself will best be understood, from a study of the following description and appended claims, with reference had to the attached drawings showing a preferred embodiment of our invention.

DETAILED DESCRIPTION OF THE INVENTION

Figure 1:
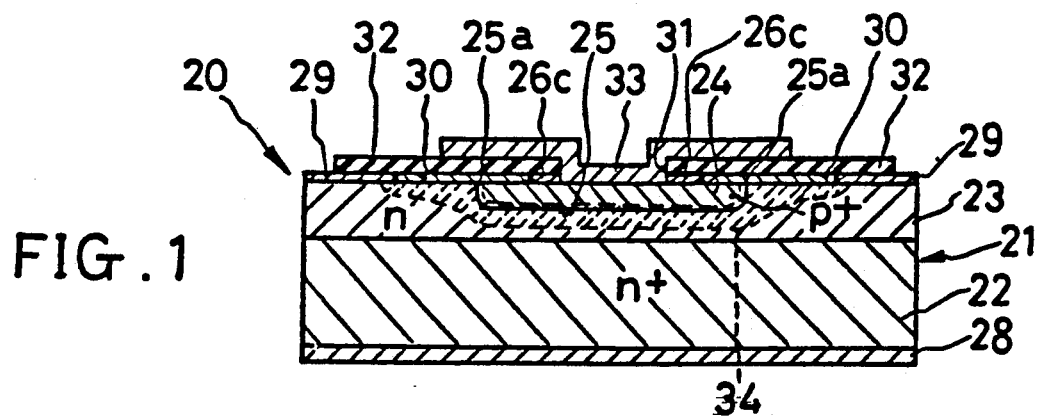
FIG. 1 is a diagrammatic section through a p-n junction diode embodying the principles of our invention.

The high speed rectifier diode 20 of FIG. 1 embodies all the structural features of our invention. We will first describe the method we adopted for making this diode 20.

Figure 2A:
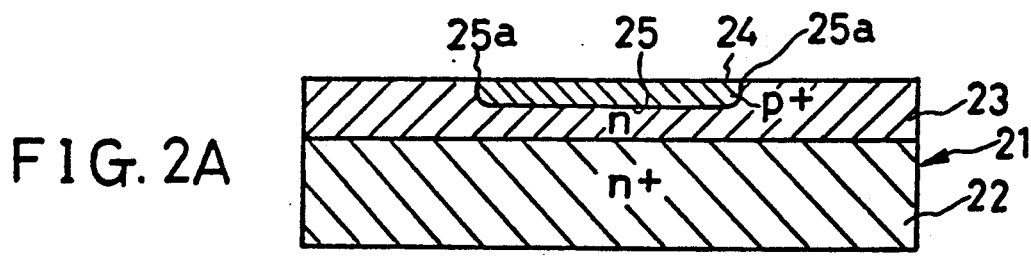
FIGS. 2A through 2F are a series of sectional illustrations diagrammatically illustrating the sequential steps of fabricating the diode of FIG. 1 by the method of our invention.

The fabrication of the rectifier diode 20 started with the preparation of a semiconductor substrate seen at 21 in FIG. 2A. The substrate 21 comprised an n$^+$ type semiconductor region 22 of gallium arsenide (GaAs) and, thereover, a highly resistive n type semiconductor region 23 formed by epitaxial growth of GaAs. Zinc (Zn) was diffused in central part of the n type semiconductor region 23 from the top surface of the substrate 21 to provide a p$^+$ type semiconductor region 24. A p-n junction 25 was thus created at the interface between the n type semiconductor region 23 and the p$^+$ type semiconductor region 24. It will be seen that the p-n junction 25 has an annular periphery 25a exposed at the top surface of the substrate 21.

The impurity concentration of the n type semiconductor region 23 was $1.8 \times 10^{15}$ cm$^{-3}$. Its thickness was 1.5 micrometers ($\mu$m). The impurity concentration of the p$^+$ type semiconductor region 24 in the neighborhood of its exposed top surface was $5 \times 10^{18}$ cm$^{-3}$. Its thickness was approximately 3 $\mu$m. Thus the p$^+$ type semiconductor region 24 was considerably higher in impurity concentration, and considerably less in resistivity, than the n type semiconductor region 23.

Figure 2B:
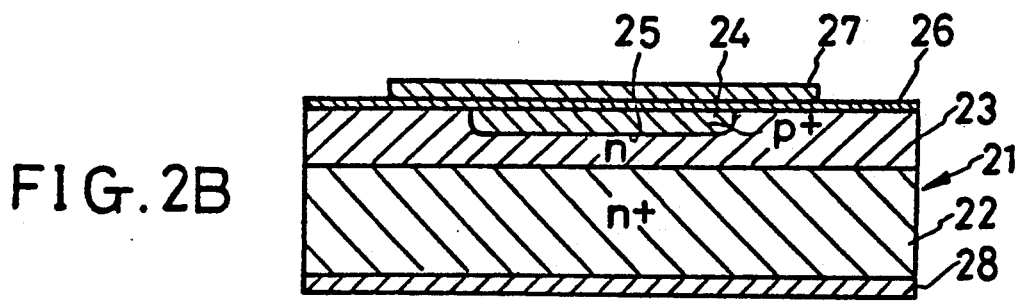

Then, as illustrated in FIG. 2B, an ultrathin layer 26 of titanium (Ti) and a thicker layer 27 of aluminum (Al) were vacuum deposited one after the other on the entire top surface of the semiconductor substrate 21. The Al layer 27 had its peripheral portion subsequently etched away to expose the corresponding marginal portion of the underlying Ti layer 26. The Ti layer 26 was 50 angstroms (Å), or 0.005 μm, thick. The Al layer 27 was 5000 Å thick.

FIG. 2B also shows an ohmic contact electrode 28 covering the complete bottom surface of the semiconductor substrate 21. We formed this electrode 28 by successively vacuum depositing an alloy of Gold (Au) and germanium (Ge), and then Au only, on the substrate bottom surface.

Figure 2C:
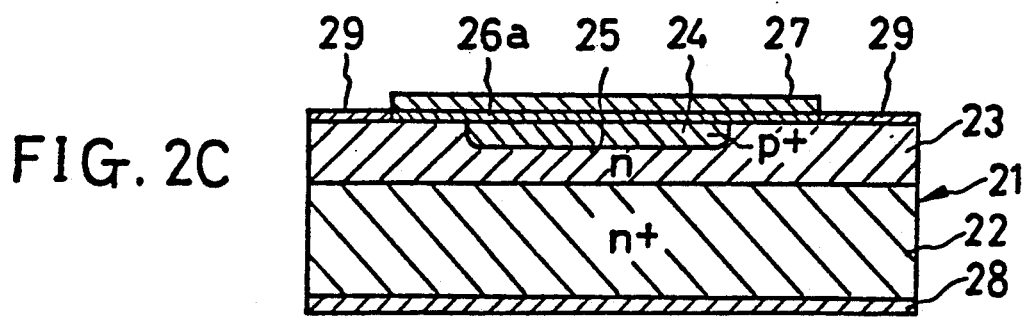

Then we heated the FIG. 2B article to 300° C. and held it at that temperature for 20 minutes in air. FIG. 2C shows the resulting article. The heat treatment turned the exposed marginal portion of the Ti layer into a Ti oxide layer 29. Underlying the Al layer 27, the other part 26a of the Ti layer remained unoxidized. We surmise that the Ti oxide layer 29 is approximately one and a half times as thick as the Ti layer 26 of the FIG. 2B article. Actually, the Ti oxide layer 29 was too thin to measure its exact thickness. The sheet resistance of the Ti oxide layer 29 was 50,000 megohms per square (MΩ/s). We may therefore think of the Ti oxide layer 29 as being insulating rather than resistive.

Figure 2D:
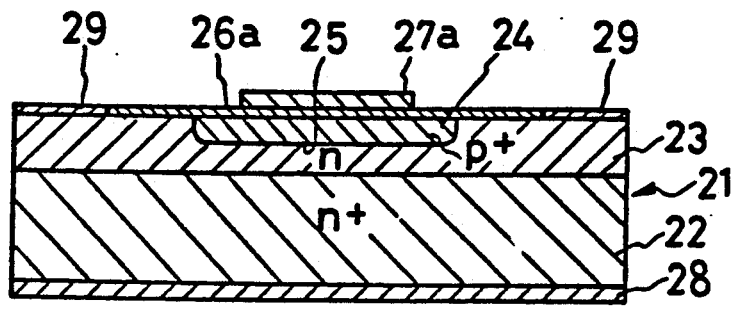

Then we etched away peripheral part of the Al layer 27 as in FIG. 2D, leaving only central part 27a of the Al layer which was smaller in size than the p+ type semiconductor region 24. There was thus exposed the marginal part of the Ti layer 26a over the peripheral part 25a of the p-n junction 25.

Then we subjected the FIG. 2D article to another heat treatment, holding the article at 275° C. for 15 minutes in air. Consequently, as will be understood from FIG. 2E, the part of the Ti layer 26a which was not masked by the Al layer 27a was oxidized into a second Ti oxide layer 30 flush with the first recited Ti oxide layer 29. The second Ti oxide layer 30 was of substantially the same thickness as the first Ti oxide layer 29. The sheet resistance of the second Ti oxide layer 30 was approximately 100 MΩ/s, which was much less than that of the first Ti oxide layer 29, so that we can regard the second Ti oxide layer as being semi-insulating. The second Ti oxide layer 30 extends across the exposed periphery 25a of the p-n junction 25 in this embodiment, as seen cross sectionally as in FIG. 2E. Also as viewed in a plan view as in FIG. 3, the second Ti oxide layer 30 takes the form of a ring extending along the periphery 25a of the p-n junction 25. It will also be noted from FIG. 2E that an unoxidized Ti layer 26b remains under the Al layer 27a.

Figure 2E:
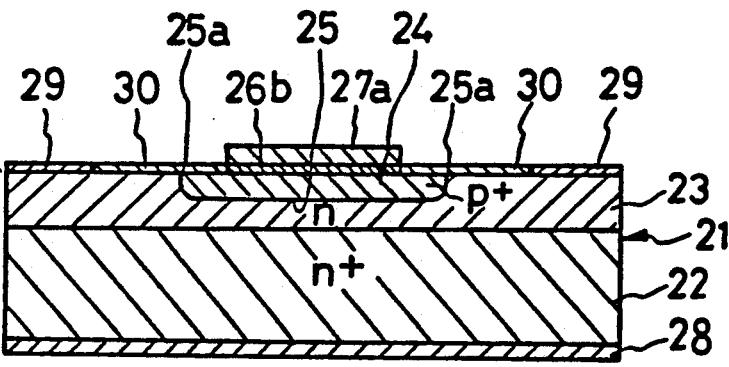
Figure 2F:
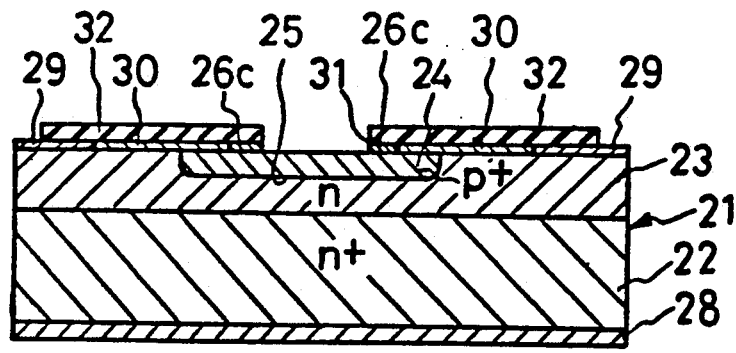
Figure 3:
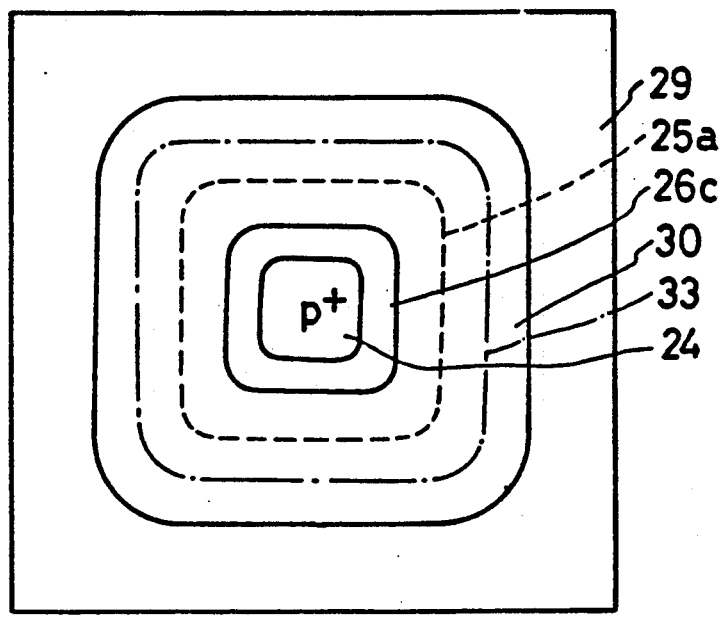
FIG. 3 is a diagrammatic top plan of the article of FIG. 2F, the view not showing the silicon oxide film of the FIG. 2F article in order to clearly reveal the other parts.

Then, after etching away the Al layer 27a of the FIG. 2E article, we formed a silicon oxide film 32, FIG. 2F, over the entire top surface of the article by plasma chemical vapor deposition, although we could have employed photochemical vacpor deposition. We proceeded to etch away the marginal part of the silicon oxide film 32, and the central part of the silicon oxide film 32 together with the underlying part of the Ti layer 26b. FIG. 2F illustrates the resulting article. It will be noted that the silicon oxide film 32 is centrally apertured at 31, with the annular remainder 26c of the Ti layer also boundign the aperture 31.

Then we proceeded to successive vacuum deposition of an Au-Zn alloy and Au over the complete top surface of the FIG. 2F article. Then we etched away the peripheral part of the layer thus formed, thereby completing an ohmic electrode 33, FIG. 1, in contact with the p+type semiconductor region 24. As indicated by the phantom outline in FIG. 3, the electrode 33 extends outwardly beyond the periphery 25a of the p-n junction 25 and so somewhat performs the function of a field plate.

Fabricated as in the foregoing by the method of our invention, the rectifier diode 20 has proved to operate at very high speed, as is usually the case with GaAs devices. A more prounced feature of the diode 20 of the improved construction in accordance with our invention is its high breakdown voltage. The breakdown voltage of the particular diode produced as above was 230 V, compared with 100 V or so of breakdown voltages possessed by diodes of comparable prior art construction. This breakdown voltage of the diode in accordance with our invention is much higher than that of the known device with the field plate and even more than that of the known field limiting ring device. It has also proved that the diodes constructed in accordance with our invention suffer little fluctuations in breakdown voltage arising from differences in the surface conditions of the semiconductor substrates, such fluctuations having been particularly manifest with the prior art field plate and field limiting ring devices. Our invention has also overcome the variations in the breakdown voltages of the conventional field plate diodes that have been caused by the insulating layers during operation at elevated temperatures. No particular difficulties will be encountered, either, in designing and manufacturing semiconductor devices in accordance with our invention.

We ascribe the high breakdown voltage of the diode 20 primarily to its two structural features. One is the fact that that part of the second Ti oxide layer 30 which directly overlies the n type semiconductor region 23 creates a Schottky barrier and performs the same functions as the field plate. The other is the fact that the Schottky barrier is formed by the highly resistive Ti oxide layer 30 instead of by a metal layer. Because of the potential gradient across the second Ti oxide layer 30 the reverse voltage impressed to the Schottky barrier lessens toward the periphery of the second Ti oxide layer. Consequently, as indicated by the phantom hatching in FIG. 1, there is created a tapering depletion layer 34. Moreover, as no insulating layer exists between the semiconductor region and the second Ti oxide layer, the diode 20 is to suffer no such instability in performance characteristics as would be caused by the presence of such an insulating layer. It is also an advantage that, being in direct contact with the semiconductor region, the second Ti oxide layer 30 favorably acts thereon.

We have stated that the first Ti oxide layer 29 is more of the nature of an insulator than that of a resistor. It is therefore assumed that this Ti oxide layer does not form a Schottky barrier between itself and the n type semiconductor region 23. We do believe, however, that the first Ti oxide layer 29 aids in the creation of the depletion layer in the n type semiconductor region 23.

In order to experiment the utility of the first Ti oxide layer 29 we produced a diode similar in construction to the FIG. 1 diode 20 except for the absence of the first Ti oxide layer. In this experimental diode a series of breakdowns took place at limited regions in the periphery of the second Ti oxide layer 30 before the breakdown of the p-n junction 25, as indicated at I on the curve A in the reverse voltage versus reverse current graph of FIG. 4.

Obviously, the provision of the first Ti oxide layer 29 as in the FIG. 1 diode 20 serves to enhance the voltage withstanding capability of the neighboring part of the Schottky barrier. As represented at II on the curve B in the graph of FIG. 4, the breakdowns of the limited peripheral regions of the second Ti oxide layer 30 occurred at higher reverse voltages. We have further confirmed by experiment that the breakdowns of the limited peripheral regions of the second Ti oxide layer can be totally eliminated, as indicated by the curve C in FIG. 4, by making suitably long the period of oxidation needed for the provision of the second Ti oxide layer 30. It will be seen that the first Ti oxide layer 29 functions primarily to reduce the amount of the reverse current.

Figure 4:
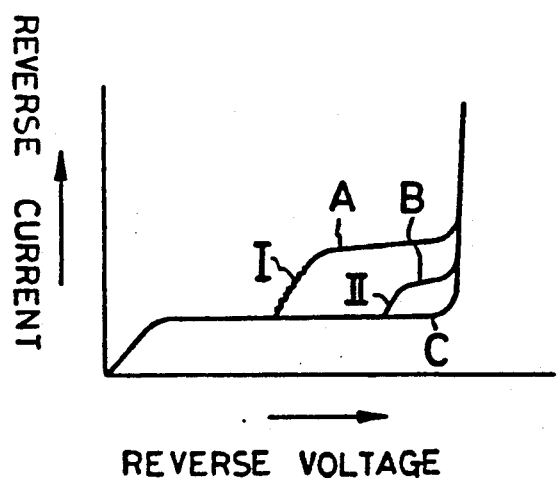
FIG. 4 is a graphic representation of the reverse voltage versus reverse current characteristics of some diodes, including the diode of FIG. 1, which are useful in explaining the principles of our invention.

We do not, however, wish to exclude from the scope of our invention the diode constructions represented by the curves A and B in FIG. 4. The rise in electric current resulting from the limited breakdowns indicated by these curves does not exceed the level determined by the resistivity of the second Ti oxide layer 30 and the potential difference across the first Ti oxide layer 29. The main breakdown voltages of these diodes are not affected.

POSSIBLE MODIFICATIONS

Although we have shown and described our invention in very specific aspects thereof, we do not wish our invention to be limited by the exact details of the foregoing disclosure. The following is a brief list of possible modifications of the illustrated embodiment that may be resorted to without departing from the scope of our invention:

1. The sheet resistance of the second Ti oxide layer 30 could be set any where in the range of 10 kΩ/s to 5000 MΩ/s, preferably 10 to 1000 MΩ/s.

2. The thickness of the second Ti oxide layer could be anywhere from 20 to 300 Å, and its dimension in a direction parallel to the surface of the n type semiconductor region 23 could be anywhere from 30 to 500 μm.

3. The second Ti oxide layer could be formed by the vacuum deposition, sputtering, etc., of the Ti oxide itself. We recomment, however, the oxidation of the Ti layer preformed in place on the semiconductor substrate, as in the embodiment disclosed herein, for better contact of the Ti oxide layer with the semiconductor.

4. The periphery of the second Ti oxide layer could be placed in contact with the n type semiconductor region 23 via an ohmic electrode for the provision of a diode of reduced noise production.

5. An unoxidized Ti region could be left in the middle of the second Ti oxide layer for stabilizing the potential distribution across the layer.

6. The second Ti oxide layer could be divided into a lower layer of relatively high sheet resistance and an upper layer of less sheet resistance.

7. The invention may be applied to mesa structures with the p-n junction.

8. Either or both of the first Ti oxide layer 29 and the Ti layer 26c could be omitted.

9. The second Ti oxide layer could not include the part overlying the p+ type semiconductor region 24.

10. The second Ti oxide layer could be spaced outwardly from the periphery 25a of the p-n junction 25, only to such an extent that a continuous depletion layer could be formed due to the p-n junction and to the Schottky barrier created by the Ti oxide layer. In cases where the second Ti oxide layer is formed only on the n type semiconductor region 23, means may be provided for connecting this oxide layer to the electrode 33.

11. Tantalum oxide or other materials could be employed in lieu of Ti oxide to provide a layer of high sheet resistance capable of creating a Schottky barrier.

12. The invention could be applied not only to GaAs semiconductor devices but to those of other compounds of the elements of Groups III-V of the Periodic Table such as aluminum gallium arsenide, gallium phosphide, and indium phosphide, as well as to those of silicon and other compounds.

What we claim is:

1. A method of making a p-n junction semiconductor device which comprises:
    (a) providing a semiconductor substrate comprising first and second regions of opposite conductivity types providing a p-n junction therebetween, the first semiconductor region being of higher resistivity than the second semiconductor region, the first and second semiconductor regions being both exposed through a predetermined surface of the substrate;
    (b) forming a layer of a first metal on the predetermined surface of the substrate;
    (c) forming a layer of second metal on the first metal layer;
    (d) removing a peripheral part of the second metal layer so as to leave the remainder of the second metal layer on the second semiconductor region of the substrate via the first metal layer, with the consequent exposure of a peripheral part of the first metal layer; and
    (e) oxidizing the exposed peripheral part of the first metal layer through a mask of the remaining part of the second metal layer in order to form a resistive layer of the oxide of the first metal capable of forming a Schottky barrier at its interface with the first semiconductor region of the substrate.

2. The method of claim 1 wherein the first metal is titanium.

3. The method of claim 1 wherein the resistive layer of the oxide of the first metal is from 20 to 300 angstroms in thickness.

4. The method of claim 1 wherein the first and second metal layers are formed by vacuum deposition.

* * * * *